United States Patent
Zhuang et al.

(10) Patent No.: US 8,045,662 B2
(45) Date of Patent: Oct. 25, 2011

(54) BINARY RIPPLE COUNTER SAMPLING WITH ADJUSTABLE DELAYS

(75) Inventors: Jingcheng Zhuang, Allen, TX (US); Robert Bogdan Staszewski, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 672 days.

(21) Appl. No.: 12/143,008

(22) Filed: Jun. 20, 2008

(65) Prior Publication Data

US 2008/0317189 A1 Dec. 25, 2008

Related U.S. Application Data

(60) Provisional application No. 60/945,824, filed on Jun. 22, 2007.

(51) Int. Cl.
*H04L 7/00* (2006.01)
(52) U.S. Cl. .......................... 375/354; 327/141; 370/229
(58) Field of Classification Search .................... 375/354
See application file for complete search history.

(56) References Cited

U.S. PATENT DOCUMENTS

| | | | | | |
|---|---|---|---|---|---|
| 4,031,532 | A | * | 6/1977 | First | 341/157 |
| 4,612,658 | A | * | 9/1986 | Eby | 377/52 |
| 4,741,004 | A | * | 4/1988 | Kane | 377/110 |
| 4,856,035 | A | * | 8/1989 | Lewis | 377/116 |
| 4,910,797 | A | * | 3/1990 | Min et al. | 455/249.1 |
| 5,425,074 | A | * | 6/1995 | Wong | 377/47 |
| 5,689,345 | A | * | 11/1997 | Harton | 358/3.29 |
| 6,122,296 | A | * | 9/2000 | Shih | 370/532 |
| 6,137,333 | A | * | 10/2000 | Williams et al. | 327/261 |
| 6,285,172 | B1 | * | 9/2001 | Torbey | 323/237 |
| 6,388,600 | B1 | * | 5/2002 | Johnson et al. | 341/155 |
| 6,946,881 | B1 | * | 9/2005 | Chan | 327/28 |
| 7,236,557 | B1 | * | 6/2007 | Nguyen | 377/47 |
| 7,728,642 | B1 | * | 6/2010 | O'Dwyer | 327/265 |
| 7,742,551 | B2 | * | 6/2010 | Pyeon | 375/354 |
| 2004/0125905 | A1 | * | 7/2004 | Vlasenko et al. | 375/376 |
| 2005/0259239 | A1 | * | 11/2005 | Lin et al. | 356/5.01 |
| 2007/0237277 | A1 | * | 10/2007 | Unterricker | 375/375 |
| 2008/0317189 | A1 | * | 12/2008 | Zhuang et al. | 375/376 |

* cited by examiner

*Primary Examiner* — Chieh M Fan
*Assistant Examiner* — Santiago Garcia
(74) *Attorney, Agent, or Firm* — John R. Pessetto; W. James Brady; Frederick J. Telecky, Jr.

(57) ABSTRACT

The output bits of a binary ripple counter are used to control the sampling of those output bits, thereby ensuring accurate sampling. A sampler is provided with adjustable delay elements that permit accurate sampling regardless of: delay mismatch between the sampler and a data path of the counter; the length of the counter; operating speed; or PVT variations.

6 Claims, 3 Drawing Sheets

US 8,045,662 B2

BINARY RIPPLE COUNTER SAMPLING WITH ADJUSTABLE DELAYS

This application claims priority to U.S. Provisional Application No. 60/945,824, filed on Jun. 22, 2007.

FIELD OF THE INVENTION

The invention relates generally to sampling digital signals and, more particularly, to sampling the output bits of a binary ripple counter.

BACKGROUND OF THE INVENTION

FIG. 1 diagrammatically illustrates a conventional arrangement including a binary ripple counter 12 coupled to a sampler 11 that samples the output bits D0, D1, D2, etc. from respective count stages of the binary ripple counter. Such an arrangement is useful in many applications. One example is determining the phase of a digitally controlled oscillator (DCO). The structure and operation of the binary ripple counter 12 and the sampler 11 shown in FIG. 1 are known in the art. (See, e.g., US Patent Publication No. 2005/0195917, and U.S. Ser. No. 12/134,081 entitled "A Low Power All Digital PLL Architecture", filed Jun. 5, 2008, both of which are incorporated herein by reference.) A series configuration of delay elements 13, 14, etc. functions as a sampling controller that produces respectively delayed versions, C1, C2, etc., of a base sample clock signal C0, which is in turn a delayed version of an input clock signal denoted as Clock 2. The clock signals C0, C1, C2, etc. are sample control signals used to clock respective latch stages of sampler 11 that sample the respective output bits D0, D1, D2, etc. A count clock signal, denoted as Clock 1, drives the binary ripple counter 12.

The sampling operations performed by the arrangement of FIG. 1 can be challenging at high operating speeds, due to skew among the output bits D0, D1, D2, etc. Ideally, the delays between the clock signals C0, C1, C2, etc. in the sampling clock path should be matched to the respectively corresponding delays in the data path through the binary ripple counter 12. In that case, if bit D0 can be sampled correctly at PHV(0), then bit D1 can also be sampled correctly at PHV(1), etc. This ideal situation is shown in FIG. 2, wherein each of the sample clock signals C0, C1, C2, etc. becomes active to sample the corresponding output bit D0, D1, D2, etc. after a common delay interval has elapsed since the transition of the corresponding output bit.

However, the required resolution of the delay matching between the clock path and the data path increases with increases in the operating speed. The error tolerance associated with the sampling points for more significant bits is the same as the error tolerance associated with the least significant bit D0, but larger delay mismatches can be expected for the more significant bits due to the accumulation of delay mismatches at each additional count stage of the counter. Consequently, the sampler 11 of FIG. 1 may not function suitably as the frequency of Clock 2 increases.

It is therefore desirable to provide for accurately sampling a binary ripple counter even at high operating frequencies.

DETAILED DESCRIPTION

According to exemplary embodiments of the invention, the output bits of a binary ripple counter are used to control the sampling of those output bits, thereby ensuring accurate sampling.

Figure 1:
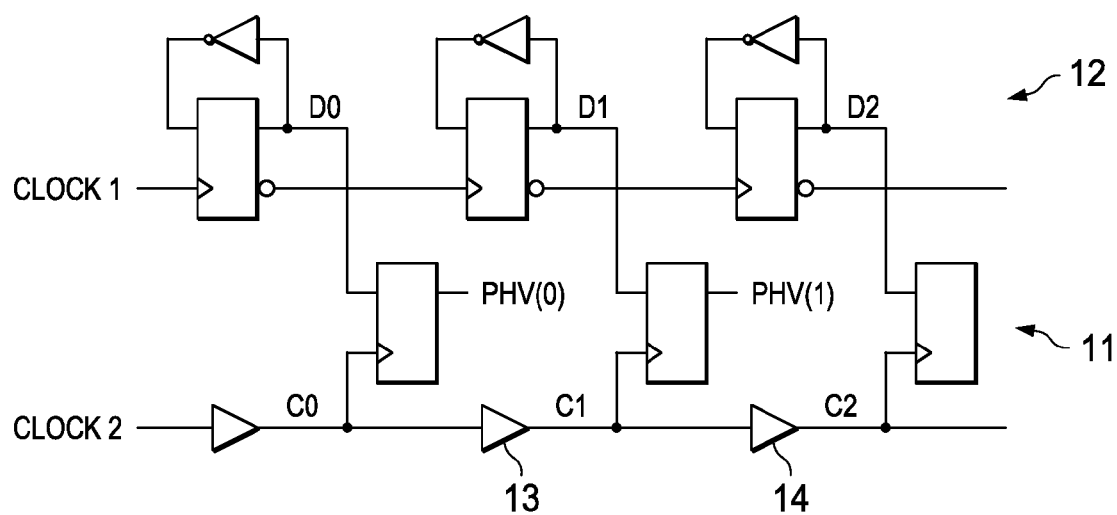
FIG. 1 diagrammatically illustrates a binary ripple counter sampling arrangement according to the prior art.
Figure 2:
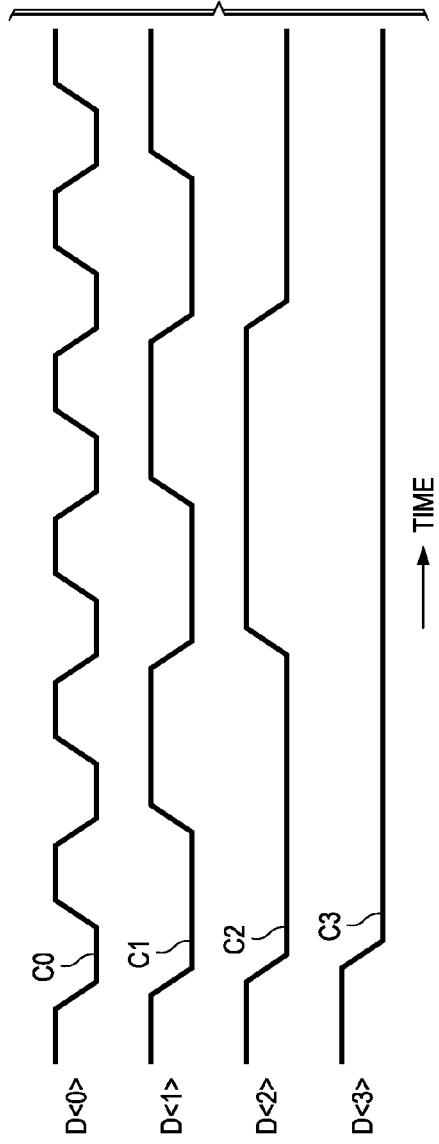
FIG. 2 is a timing diagram that illustrates ideal binary ripple counter sampling.
Figure 3:
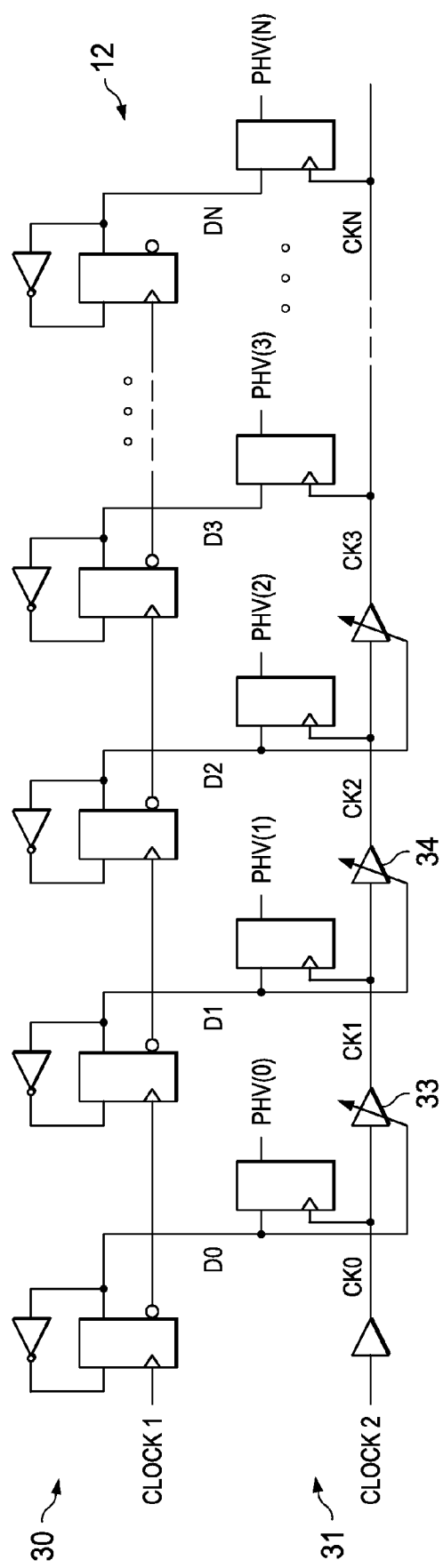
FIG. 3 diagrammatically illustrates a binary ripple counter sampling arrangement according to exemplary embodiments of the invention.

FIG. 3 diagrammatically illustrates an arrangement for sampling the output of a binary ripple counter according to exemplary embodiments of the invention. The arrangement 30 shown in FIG. 3 is generally similar to the arrangement of FIG. 1, and includes the binary ripple counter 12 of FIG. 1. However, the arrangement 30 includes a sampler 31 whose sampling controller employs a series configuration of adjustable clock delay elements 33, 34, etc. that produce respectively delayed versions CK1, CK2, etc. of the base sample clock signal CK0. In some embodiments, CK0 corresponds to C0 of FIG. 1. The clock signals CK0, CK1, CK2, etc. are sample control signals used to clock the respective latch stages of sampler 31 that sample the respective output bits D0, D1, D2, etc. The adjustable clock delay elements 33, 34, etc. have respective delay control inputs that are driven by the respective output bits D0, D1, etc. Thus, the sampling controller receives a delay control signal having the output bits of the binary ripple counter 12 as constituent components. Consequently, the sampling instance of the output bits D0, D1, etc. is adjusted based on these output bits themselves.

Let the delay between adjacent binary ripple counter output bits Di and Di−1 be $\partial_{di}$, and let the delay between adjacent clock signals CKi and CKi−1 be $\partial_{CKi}$. The conventional delay matching approach described above in connection with FIG. 1 would require $\partial_{di}=\partial_{CKi}$ to guarantee correct sampling. This requirement gives rise to the aforementioned difficulties associated with sampling the more significant output bits of the binary ripple counter, and with sampling at high operating speeds.

Exemplary embodiments of the invention set $\partial_{CKi}=\partial_{di}+\Delta_i$ when Di−1=0, and further set $\partial_{CKi}=\partial_{di}-\Delta_i$ when Di−1=1, where $\Delta_i$ can take any value that is at least slightly larger than $\epsilon_i$, the peak-to-peak value of the clock delay mismatch (with respect to the data delay path) associated with the i th stage of the binary ripple counter 12. If Di−1=0, the clock delay mismatch $\epsilon_i$ associated with sampling Di can be expected to exhibit a negative value, that is, $-\epsilon_i$. Accordingly, when Di−1=0, the associated adjustable delay element increases $\partial_{CKi}$ relative to $\partial_{di}$ by $\Delta_i$ ($\partial_{CKi}=\partial_{di}+\Delta_i$, where $\Delta_i>\epsilon_i$) to ensure correct sampling. Conversely, if Di−1=1, the clock delay mismatch $\epsilon_i$ associated with sampling Di can be expected to exhibit a positive value, that is, $+\epsilon_i$. Accordingly, when Di−1=1, the associated adjustable delay element decreases $\partial_{CKi}$ relative to $\partial_{di}$ by $\Delta_i$ ($\partial_{CKi}=\partial_{di}-\Delta_i$, where $\Delta_i>\epsilon_i$) to ensure correct sampling.

Therefore, according to the arrangement of FIG. 3, if the first bit D0 can be sampled correctly using the base sample clock signal CK0, then D1 can also be sampled correctly by CK1, which in turn means that D2 can be sampled correctly by CK2, and so on. As such, if D0 can be sampled correctly, then all of the remaining bits D1-DN can also be sampled correctly, regardless of delay mismatch, ripple counter length, speed of operation, or PVT variation.

In various embodiments, the value of $\Delta_i$ is not required to be particularly accurate, provided it exceeds the value of $\epsilon_i$. Furthermore, various embodiments do not require either of the selectable delay values (corresponding to Di−1=0 and Di−1=1) to be centered at $\partial_{di}$. Accordingly, the adjustable delay elements 33, 34, etc. can be easily implemented according to any suitable conventional technique.

In various embodiments, the input signal designated as Clock 2 in FIG. 3 is a signal other than a periodic clock signal. This input signal can be any suitable triggering or sampling signal. In some embodiments, this input signal is a one-shot triggering signal.

Figure 4:
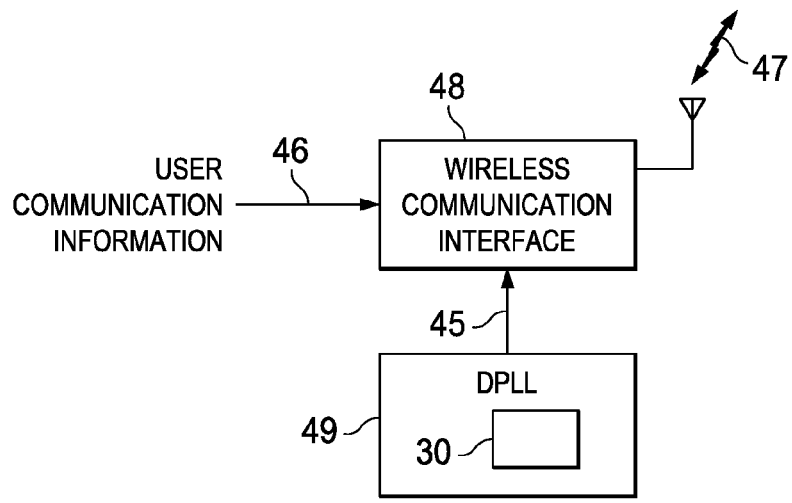
FIG. 4 diagrammatically illustrates a wireless communication apparatus according to exemplary embodiments of the invention.

FIG. 4 diagrammatically illustrates a wireless communication apparatus according to exemplary embodiments of the invention. In some embodiments, the apparatus of FIG. 4 is a mobile wireless communication apparatus such as, for example, a cellular telephone, a personal digital assistant, a laptop, palmtop or other portable computer, etc. As shown in FIG. 4, an arrangement such as shown at 30 in FIG. 3 is provided as part of a digital phase locked loop (DPLL) 49. The DPLL 49 provides frequency signals 45 (e.g., RF signals) for a wireless communication interface 48 that uses conventional techniques to transmit and receive user communication information 46 via a wireless communication link 47.

Figure 5:
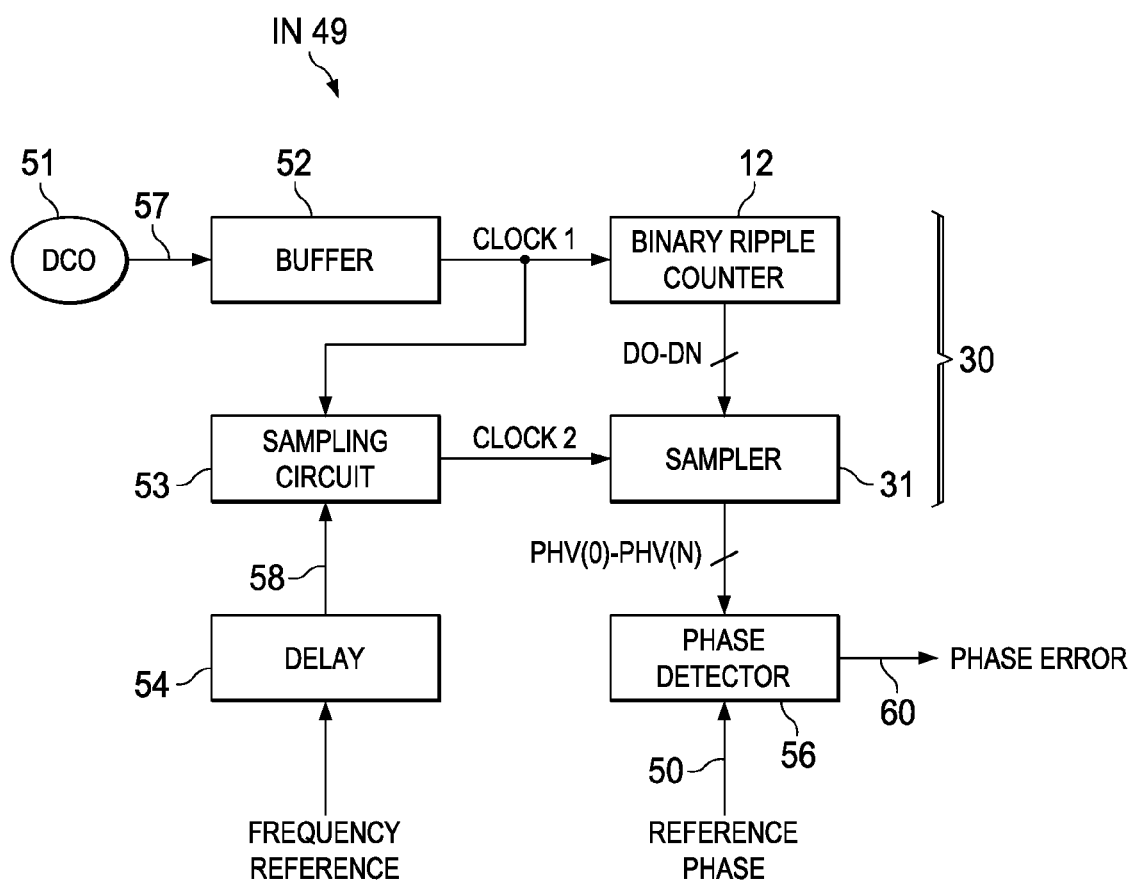
FIG. 5 diagrammatically illustrates a digital phase locked loop apparatus according to exemplary embodiments of the invention.

The use of the arrangement 30 in the DPLL 49 of FIG. 4 is illustrated in more detail in FIG. 5. (See also aforementioned U.S. patent application Ser. No. 12/134,081. In particular, the arrangement 30 is used as a phase tracker. In some embodiments, the sampled bits PHV(0)-PHV(N) output by the sampler 31 constitute a representation of the integer part of the phase of a digitally controlled oscillator (DCO) 51. In some embodiments, the Clock 1 input of the binary ripple counter 12 and the Clock 2 input of the sampler 31 (see also FIG. 3) are produced according to conventional techniques. In some embodiments, Clock 1 is a buffered version of an oscillator signal 57 produced by the DCO 51. A clock buffer 52 receives the oscillator signal 57 as its input, and produces Clock 1 as its output. Clock 2 is a delayed frequency reference that has been sampled by Clock 1. More specifically, an input frequency reference is delayed by a delay stage 54 to produce a delayed frequency reference 58. The delay is imposed in order to roughly synchronize the delayed frequency reference 58 to an edge of Clock 1. The delayed frequency reference 58 is sampled by a sampling circuit 53 in response to Clock 1. A constant offset of approximately one-half cycle of Clock 1 is maintained by such synchronization so that the metastable region of the sampling circuit 53 can be avoided. Clock 2 is the sampled signal that the sampling circuit 53 provides as its output.

A phase detector 56 compares the integer part of reference phase information (designated generally at 50) with the aforementioned oscillator phase information (represented by PHV (0)-PHV(N)) produced by the sampler 31). The result 60 of this comparison represents the integer part of a phase error associated with the DCO 51. In some embodiments, this result 60 is provided for conventional use by other components (not explicitly shown) of the DPLL 49.

Although exemplary embodiments of the invention have been described above in detail, this does not limit the scope of the invention, which can be practiced in a variety of embodiments.

What is claimed is:

1. An apparatus for sampling the stages of a binary ripple counter, comprising:
   a plurality of sampling stages having respective data inputs for receiving data from respectively corresponding stages of the binary ripple counter, said sampling stages having respective sample control inputs that receive respective sample control signals, said sampling stages responsive to the respective sample control signals for sampling the data at said data inputs thereof; and
   a sampling controller coupled to said sample control inputs for providing said sample control signals, said sampling controller configured to produce respective ones of said sample control signals by delaying a sample signal by respectively corresponding amounts of time, said sampling controller having a delay control input for receiving a delay control signal, and said sampling controller further configured to adjust said amounts of time based on said delay control signal;
   wherein said sampling controller includes a plurality of adjustable delay elements arranged in a series configuration that is coupled to receive said sample signal, wherein said delay control signal has a plurality of constituent delay control signal components, and wherein said adjustable delay elements are respectively coupled to receive said delay control signal components from said delay control input;
   wherein each of said delay control signal components is a bit from a respectively corresponding one of the stages of the binary ripple counter;
   wherein each of said adjustable delay elements is configured to impose a first amount of delay if the corresponding delay control signal component is 0, and a second amount of delay if the corresponding delay control signal component is 1, and wherein said first and second amounts of delay differ from one another.

2. The apparatus of claim 1, wherein said first amount of delay is greater than said second amount of delay.

3. The apparatus of claim 2, wherein said sample control input of one of said sampling stages is coupled to receive said sample signal as said sample control signal of said one sampling stage, and said sample control inputs of a remainder of said sampling stages are coupled to respective outputs of said adjustable delay elements.

4. A method of sampling the stages of a binary ripple counter, comprising:
   receiving data signals from the stages of the binary ripple counter;
   sampling the data signals in response to respectively corresponding sample control signals;
   producing respective ones of said sample control signals by delaying a sample signal by respectively corresponding amounts of time; and
   adjusting said amounts of time based on a delay control signal;
   wherein said delay control signal has a plurality of constituent delay control signal components that respectively correspond to said amounts of time;
   wherein each of said delay control signal components is a bit from a respectively corresponding one of the stages of the binary ripple counter;
   wherein said delaying includes imposing a first amount of delay if the corresponding delay control signal component is 0, and a second amount of delay if the corresponding delay control signal component is 1, and wherein said first and second amounts of delay differ from one another.

5. The method of claim 4, wherein said first amount of delay is greater than said second amount of delay.

6. A digital phase locked loop apparatus, comprising:
a digitally controlled oscillator that provides an oscillator signal;
a phase tracker coupled to said digitally controlled oscillator and configured to provide oscillator phase information indicative of a phase of said oscillator signal; and
a phase detector coupled to said phase tracker and configured to compare said oscillator phase information to reference phase information;
said phase tracker including a binary ripple counter having a plurality of count stages, and a sampler coupled to said binary ripple counter for sampling said count stages of said binary ripple counter, said sampler including a plurality of sampling stages having respective data inputs for receiving data from respectively corresponding count stages of said binary ripple counter, said sampling stages having respective sample control inputs that receive respective sample control signals, said sampling stages responsive to the respective sample control signals for sampling the data at said data inputs thereof, said sampling stages having respective data outputs that collectively provide said oscillator phase information, said sampler further including a sampling controller coupled to said sample control inputs for providing said sample control signals, said sampling controller configured to produce respective ones of said sample control signals by delaying a sample signal by respectively corresponding amounts of time, said sampling controller having a delay control input for receiving a delay control signal, and said sampling controller further configured to adjust said amounts of time based on said delay control signal;
wherein said sampling controller includes a plurality of adjustable delay elements arranged in a series configuration that is coupled to receive said sample signal, wherein said delay control signal has a plurality of constituent delay control signal components, and wherein said adjustable delay elements are respectively coupled to receive said delay control signal components from said delay control input;
wherein each of said delay control signal components is a bit from a respectively corresponding one of the stages of the binary ripple counter;
wherein each of said adjustable delay elements is configured to impose a first amount of delay if the corresponding delay control signal component is 0, and a second amount of delay if the corresponding delay control signal component is 1, and wherein said first and second amounts of delay differ from one another.

* * * * *